(12) United States Patent
Wang et al.

(10) Patent No.: US 11,811,337 B2
(45) Date of Patent: Nov. 7, 2023

(54) NANOFIBER ACTUATOR AND METHOD FOR MAKING THE SAME

(71) Applicants: Tsinghua University, Beijing (CN); HON HAI PRECISION INDUSTRY CO., LTD., New Taipei (TW)

(72) Inventors: Guang Wang, Beijing (CN); He Ma, Beijing (CN); Xiang Jin, Beijing (CN); Hua Yuan, Beijing (CN); Yang Wei, Beijing (CN); Qun-Qing Li, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 512 days.

(21) Appl. No.: 16/996,686

(22) Filed: Aug. 18, 2020

(65) Prior Publication Data
US 2021/0336564 A1    Oct. 28, 2021

(30) Foreign Application Priority Data

Apr. 28, 2020    (CN) .......................... 202010348545.7

(51) Int. Cl.
| | | |
|---|---|---|
| *H02N 99/00* | (2006.01) | |
| *B82Y 30/00* | (2011.01) | |
| *C23C 16/56* | (2006.01) | |
| *C23C 16/455* | (2006.01) | |
| *C23C 16/40* | (2006.01) | |

(52) U.S. Cl.
CPC .............. *H02N 99/00* (2013.01); *B82Y 30/00* (2013.01); *C23C 16/403* (2013.01); *C23C 16/45555* (2013.01); *C23C 16/56* (2013.01)

(58) Field of Classification Search
CPC ... C23C 14/5806; C23C 14/08; C23C 14/024; C23C 16/56; C23C 16/403; C23C 16/45555; B82Y 30/00; F03G 7/0612; F03G 7/0616; H02N 99/00
See application file for complete search history.

(56) References Cited

U.S. PATENT DOCUMENTS

| | | |
|---|---|---|
| 10,661,448 B2 | 5/2020 | Ma et al. |
| 2009/0085444 A1 | 4/2009 | Alvarez et al. |
| 2010/0288980 A1 | 11/2010 | Ittel |
| 2015/0279928 A1 | 10/2015 | Wei et al. |
| 2016/0118157 A1 | 4/2016 | Holesinger |
| 2018/0099416 A1 | 4/2018 | Ma et al. |
| 2018/0100490 A1 | 4/2018 | Ma et al. |

FOREIGN PATENT DOCUMENTS

| | | |
|---|---|---|
| CN | 108839009 | 11/2018 |
| CN | 107932475 | 7/2019 |
| TW | 200932815 | 8/2009 |
| TW | 201536669 | 10/2015 |
| TW | 201813915 | 4/2018 |
| TW | I630078 | 7/2018 |

*Primary Examiner* — Vishal V Vasisth
(74) *Attorney, Agent, or Firm* — ScienBiziP, P.C.

(57) ABSTRACT

A nanofiber actuator comprises a composite structure and a vanadium dioxide layer. The composite structure comprises a carbon nanotube wire and an aluminum oxide layer. The aluminum oxide layer is coated on a surface of the carbon nanotube wire, and the aluminum oxide layer and the carbon nanotube wire are located coaxially with each other. The vanadium dioxide layer is coated on a surface of the composite structure, and the vanadium dioxide layer and the composite structure are located non-coaxially with each other.

13 Claims, 15 Drawing Sheets

NANOFIBER ACTUATOR AND METHOD FOR MAKING THE SAME

CROSS-REFERENCE TO RELATED APPLICATIONS

This application claims all benefits accruing under 35 U.S.C. § 119 from China Patent Application No. 202010348545.7, filed on Apr. 28, 2020, in the China National Intellectual Property Administration, the contents of which are hereby incorporated by reference. The application is also related to copending applications entitled, "BIONIC ARM", U.S. patent application Ser. No. 16/996,695, filed on Aug. 18, 2020; "NANO MANIPULATER", U.S. patent application Ser. No. 16/996,697, filed on Aug. 18, 2020; "LASER REMOTE CONTROL SWITCHING SYSTEM", U.S. patent application Ser. No. 16/996,702, filed on Aug. 18, 2020.

FIELD

The present disclosure relates to a nanofiber actuator and method for making the nanofiber actuator.

BACKGROUND

An actuator is a device used to convert the other energy into mechanical energy. The type of actuator usually includes an electrostatic driven actuator, magnetic driven actuator, and thermal driven actuator, such as an electro-thermal actuator. A conventional electro-thermal actuator is a membrane structure of which a main material is polymer. When a current is applied, a temperature of the polymer is increased, which can lead to a sensible volume expansion of the polymer, and then the membrane structure bends and the electro-thermal actuator is activated. Thus, electrode materials of the electro-thermal actuator are required to be excellent conductive, flexible, and thermally stable due to its operating principle.

Composite materials containing carbon nanotubes are conductive and already being used for the electro-thermal actuator. When a current is applied, the electro-thermal composite materials containing carbon nanotubes can generate heat. Then a volume of the electro-thermal composite materials is expanded and the electro-thermal composite materials bend. However, conventional electro-thermal composite materials can only bend in one direction. An improvement in the art is preferred.

BRIEF DESCRIPTION OF THE DRAWINGS

Implementations of the present technology will now be described, by way of example only, with reference to the attached figures.

DETAILED DESCRIPTION

Figure 1:
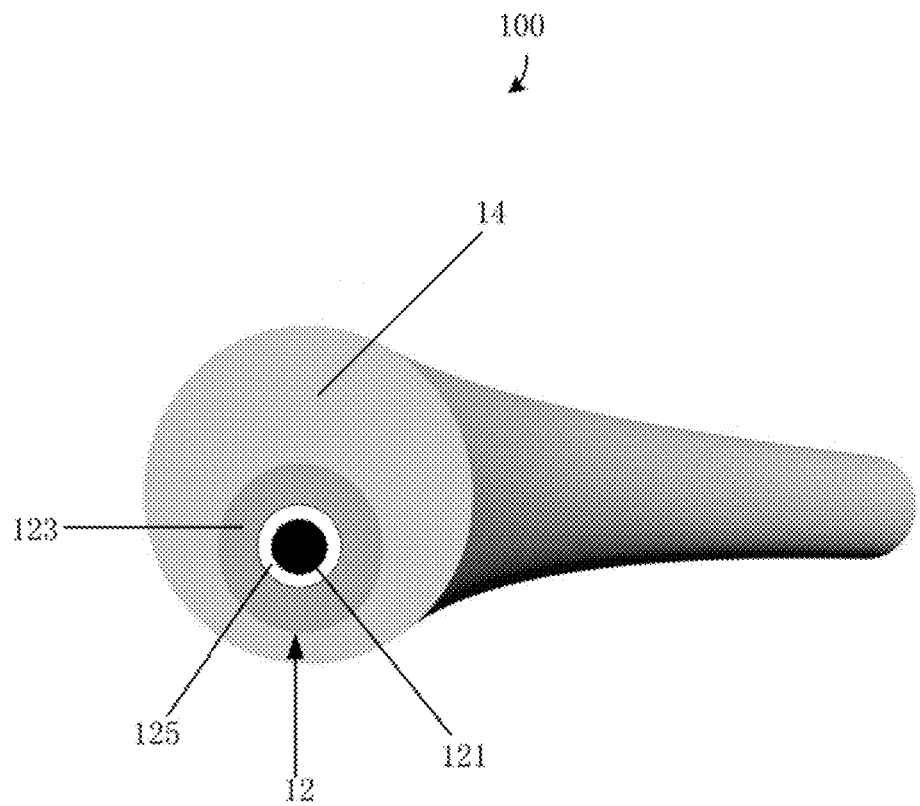
FIG. 1 is a view of one embodiment of a nanofiber actuator.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts can be exaggerated to illustrate details and features of the present disclosure better.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like.

Referring to FIG. 1, a nanofiber actuator 100 is provided in one embodiment. The nanofiber actuator 100 comprises a composite structure 12 and a vanadium dioxide layer 14. The composite structure 12 comprises a carbon nanotube wire 121 and an aluminum oxide layer 123. The aluminum oxide layer 123 is coated on a surface of the carbon nanotube wire 121, and the aluminum oxide layer 123 and the carbon nanotube wire 121 are located coaxially with each other. The vanadium dioxide layer 14 is coated on a surface of the composite structure 12, and the vanadium dioxide layer 14 and the composite structure 12 are located non-coaxially with each other.

The composite structure 12 comprises the carbon nanotube wire 121 and the aluminum oxide layer 123. In one embodiment, the composite structure 12 consists of the carbon nanotube wire 121 and the aluminum oxide layer 123. The aluminum oxide layer 123 is uniformly coated and covered on an entire outer surface of the carbon nanotube wire 121. The aluminum oxide layer 123 and the carbon nanotube wire 121 are located coaxially. A length of the carbon nanotube wire 121 is in a range from about 10 µm to about 3 cm. A diameter of the carbon nanotube wire 121 is in a range from about 0.5 nm to about 100 nm. In one embodiment, the diameter of the carbon nanotube wire 121 is in a range from about 0.5 nm to about 10 nm. A thickness of the aluminum oxide layer 123 is in a range from about 5 nm to about 100 nm. In one embodiment, the thickness of the aluminum oxide layer 123 is about 10 nm.

The carbon nanotube wire 121 is capable of forming a free-standing structure. The term "free-standing structure" can be defined as a structure that does not have to be supported by a substrate. For example, a free-standing structure can sustain the weight of itself when it is hoisted by a portion thereof without any significant damage to its structural integrity. So, if the carbon nanotube wire 121 is placed between two separate supporters, a portion of the carbon nanotube wire 121, not in contact with the two supporters, would be suspended between the two supporters and yet maintain wire structural integrity.

The carbon nanotube wire 121 comprises at least one carbon nanotube. The carbon nanotube wire 121 can consist of a single carbon nanotube. The carbon nanotube wire 121 can comprise a plurality of carbon nanotubes. When the carbon nanotube wire 121 is a single carbon nanotube, the single carbon nanotube can be a ultra-long carbon nanotube. A length of the ultra-long carbon nanotubes is greater than about 1 cm. It can be understood that the ultra-long carbon nanotubes can be cut to obtain a required length of the carbon nanotube wire 121. The preparation method of the super-long carbon nanotubes can refer to the patent application No. CN101497436A filed on Feb. 1, 2008, by Shoushan Fan et al. and published on Aug. 5, 2009. In order to save space, it is only cited here, but all the technical disclosure of the application should also be regarded as a part of the technical disclosure of the application of the present invention. In one embodiment, the carbon nanotube wire 121 is a single carbon nanotube, a length of the single carbon nanotube is about 50 microns, and a diameter of the single carbon nanotube is about 2.11 nanometers.

When the carbon nanotube wire 121 comprises a plurality of carbon nanotubes, the carbon nanotube wire 121 can be a non-twisted carbon nanotube wire or a twisted carbon nanotube wire.

Figure 3:
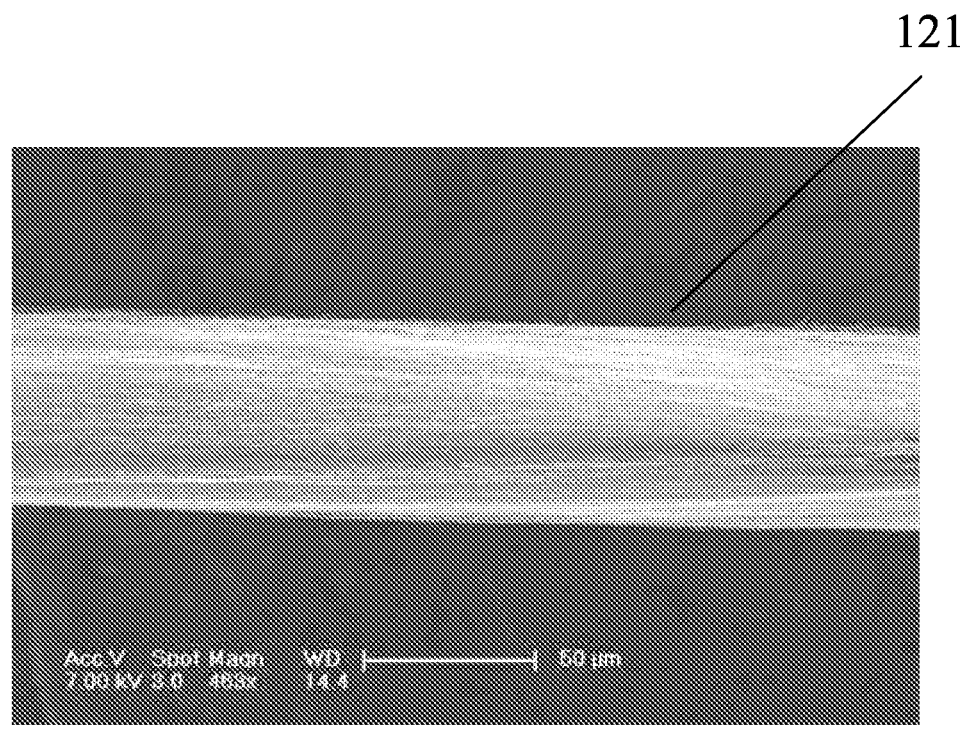
FIG. 3 is a scanning electron micrograph (SEM) image of one embodiment of a non-twisted carbon nanotube wire.

Referring to FIG. 3, the carbon nanotube wire 121 is a non-twisted carbon nanotube wire. The non-twisted carbon nanotube wire comprises a plurality of carbon nanotubes. The plurality of carbon nanotubes are substantially parallel to each other and joined end to end by Van der Waals attractive force along an axis of the carbon nanotube wire 121. The carbon nanotube wire 121 can be obtained by treating the carbon nanotube drawn film with an organic solvent. The carbon nanotube drawn film is a free-standing carbon nanotube film obtained by directly pulling from a carbon nanotube array. The carbon nanotube drawn film comprises a plurality of successively oriented carbon nanotube segments joined end-to-end by Van der Waals attractive force therebetween. Each carbon nanotube segment comprises a plurality of carbon nanotubes substantially parallel to each other and joined by Van der Waals attractive force therebetween. The carbon nanotube segments can vary in width, thickness, uniformity, and shape. The carbon nanotubes in the carbon nanotube drawn film are also substantially oriented along a preferred orientation.

Specifically, the carbon nanotube drawn film can be treated by applying organic solvent to the carbon nanotube drawn film to soak the entire surface of the carbon nanotube drawn film. The organic solvent is volatile and can be selected from the group consisting of ethanol, methanol, acetone, dichloroethane, chloroform, any appropriate mixture thereof. In one embodiment, the organic solvent is ethanol. After being soaked by the organic solvent, the non-twisted carbon nanotube wire will be formed by adjacent carbon nanotubes in the carbon nanotube drawn film that are able to do so, bundling together, due to the surface tension of the organic solvent when the organic solvent volatilizing. Compared with the carbon nanotube drawn film without organic solvent treatment, a specific surface area and viscosity of the non-twisted carbon nanotube wire are reduced. The preparation method of the carbon nanotube drawn film refers to the patent published in China No. CN101239712B filed on Feb. 9, 2007, by Shoushan Fan et al. and published on May 26, 2010. The preparation method of the non-twisted carbon nanotube wire refers to the patent published in China No. CN100411979C filed on Sep. 16, 2002, by Shoushan Fan et al. and published on Aug. 20, 2008. In order to save space, it is only cited here, but all the technical disclosure of the application should also be regarded as a part of the technical disclosure of the application of the present invention.

Figure 4:
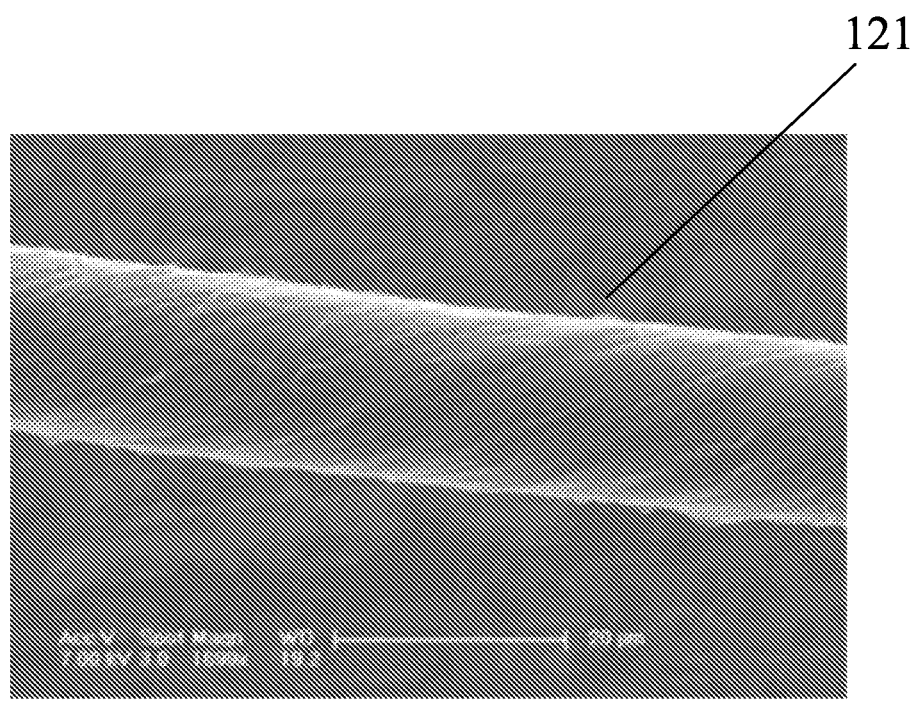
FIG. 4 is a scanning electron micrograph (SEM) image of one embodiment of a twisted carbon nanotube wire.

Referring to FIG. 4, the carbon nanotube wire 121 is a twisted carbon nanotube wire. The twisted carbon nanotube wire is formed by twisting a carbon nanotube film by using a mechanical force to turn the two ends of the carbon nanotube film in opposite directions. The twisted carbon nanotube wire comprises a plurality of carbon nanotubes oriented around an axial direction of the twisted carbon nanotube wire. The plurality of carbon nanotubes are aligned around the axis of the carbon nanotube twisted wire like a helix. More specifically, the twisted carbon nanotube wire comprises a plurality of successive carbon nanotube segment joined end to end by van der Waals attractive force therebetween. Each carbon nanotube segment comprises a plurality of carbon nanotubes parallel to each other and combined by van der Waals attractive force therebetween. The carbon nanotube segments can vary in width, thickness, uniformity, and shape. The twisted carbon nanotube wire can be treated with a volatile organic solvent. After being soaked by the organic solvent, the adjacent paralleled carbon nanotubes in the twisted carbon nanotube wire will bundle together, due to the surface tension of the organic solvent when the organic solvent volatilizing. The specific surface area of the twisted carbon nanotube wire is decreased. The density and strength of the twisted carbon nanotube wire is increased. The preparation method of the twisted carbon nanotube wire refers to the patent published in China No. CN100500556C filed on Dec. 16, 2005, by Shoushan Fan et al. and published on Jun. 17, 2009. In order to save space, it is only cited here, but all the technical disclosure of the application should also be regarded as a part of the technical disclosure of the application of the present invention.

The composite structure 12 can further comprise a carbon layer 125. In one embodiment, the composite structure 12 consists of the carbon nanotube wire 121, the carbon layer 125, and the aluminum oxide layer 123. The carbon layer 125 is located between the carbon nanotube wire 121 and the aluminum oxide layer 123. The carbon layer 125 is directly in contact with the carbon nanotube wire 121 and the aluminum oxide layer 123. The carbon layer 125 is located coaxially with the carbon nanotube wire 121 and the aluminum oxide layer 123. The carbon layer 125 uniformly covers and coats a surface of the carbon nanotube wire 121. The carbon layer 125 is an amorphous carbon layer. A thickness of the carbon layer 125 is in a range from about 0.1 nm to about 10 nm. In one embodiment, the thickness of the carbon layer 125 is about 0.92 nm.

The vanadium dioxide layer 14 is coated on the surface of the composite structure 12, that is, the vanadium dioxide layer 14 is coated on the surface of the aluminum oxide layer 123. In one embodiment, the nanofiber actuator 100 consists of the composite structure 12 and the vanadium dioxide layer 14. The vanadium dioxide layer 14 and the composite structure 12 are located non-coaxially. Specifically, referring to FIG. 1, a cross-section direction of the nanofiber actuator 100 is perpendicular to the axial direction of the nanofiber actuator 100. A thickness of the vanadium dioxide layer 14 coated on the surface of the composite structure 12 is different. That is, the composite structure 12 is located away from the axis of the nanofiber actuator 100. It can be understood that an individual vanadium dioxide layer 14 is a hollow structure, and its wall thickness is not uniform. The thickness of the vanadium dioxide layer 14 coated on the surface of the composite structure 12 is defined as a wall thickness of individual vanadium dioxide layer 14. The thickness of the vanadium dioxide layer 14 can be selected according to actual needs. A ratio between a maximum thickness of the vanadium dioxide layer 14 and a minimum thickness of the vanadium dioxide layer 14 is in a range from about 9:1 to about 7:1. In one embodiment, the ratio between the maximum thickness of the vanadium dioxide layer 14 and the minimum thickness of the vanadium dioxide layer 14 is about 8:1. In another embodiment, the maximum thickness of the vanadium dioxide layer 14 is about 72 nm, and the minimum thickness of the vanadium dioxide layer 14 is about 9 nm. Using the axis of the nanofiber actuator 100 as a reference, the side with the larger thickness of the vanadium dioxide layer 14 is defined as the first side, and the side with the smaller thickness of the vanadium dioxide layer 14 is defined as the second side.

The material of the vanadium dioxide layer 14 can be pure vanadium dioxide or doped vanadium dioxide. A phase transition temperature of the vanadium dioxide layer 14 can be changed by doping. The doped element can be tungsten, molybdenum, aluminum, phosphorus, niobium, thallium, fluorine, or combinations thereof. A weight ratio of a doping material in the vanadium dioxide layer 14 can be in a range from about 0.5% to about 5%. Doping large-sized atoms such as tungsten and molybdenum can effectively reduce the phase transition temperature of the vanadium dioxide layer 14. Doping small-sized atoms such as aluminum and phosphorus can effectively increase the phase transition temperature of the vanadium dioxide layer 14.

Figure 2:
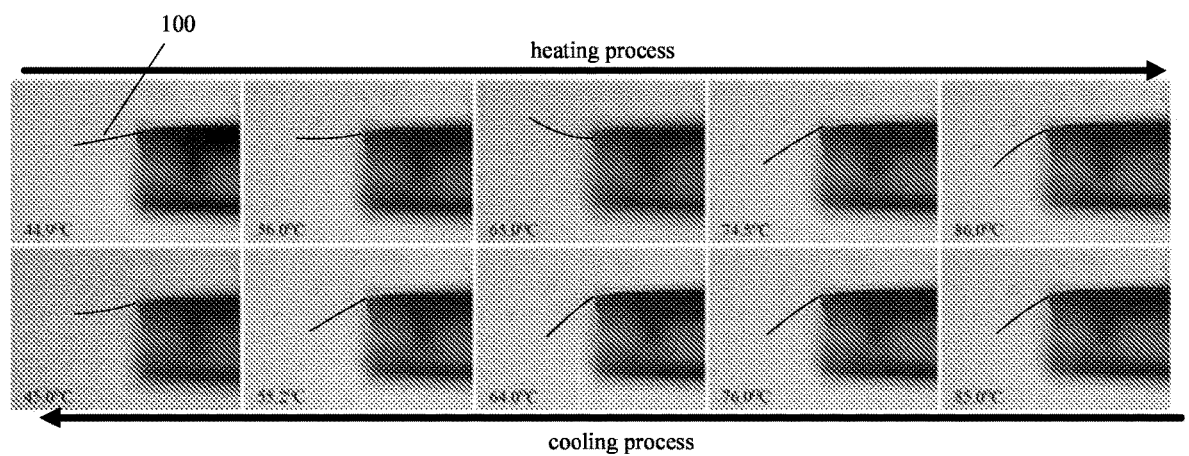
FIG. 2 is an optical photograph of one embodiment of a bending change of the nanofiber actuator during heating and cooling.
Figure 5:
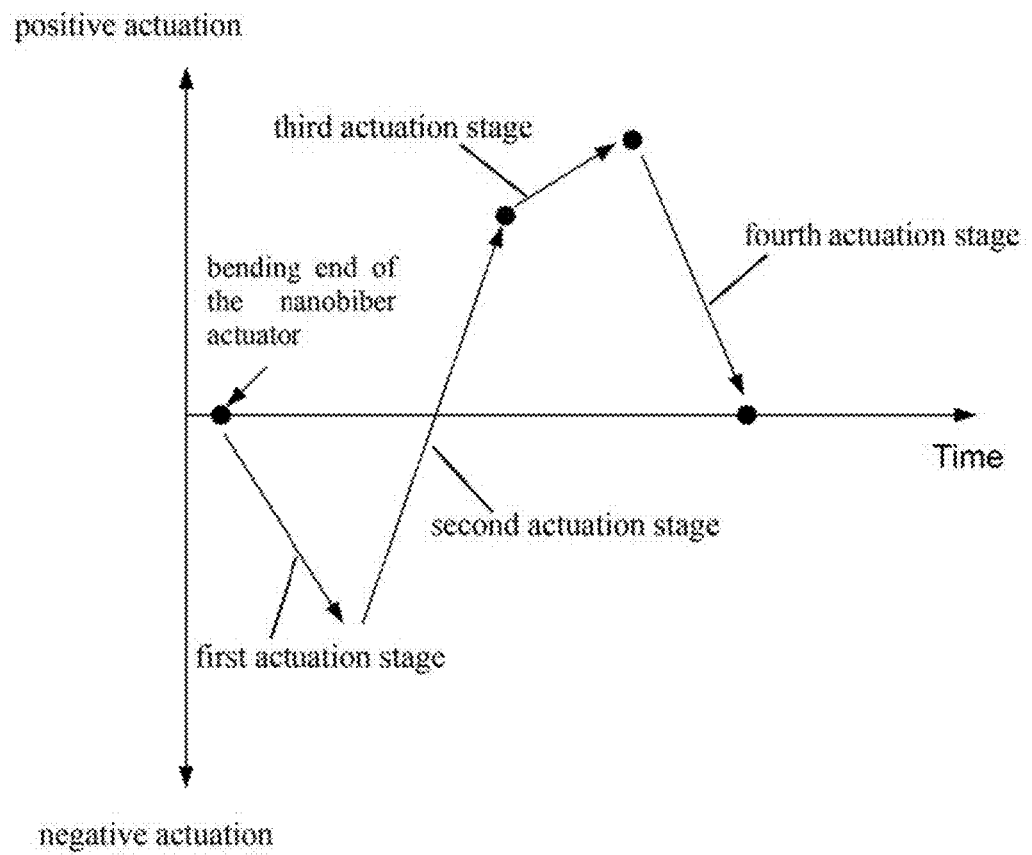
FIG. 5 is a schematic diagram of one embodiment of four actuation stages in the process of heating and cooling of the nanofiber actuator.

Referring to FIG. 4 and FIG. 5, the nanofiber actuator 100 has a bidirectional actuation characteristic. Referring to FIG. 2, one end of the nanofiber actuator 100 is fixed on a tungsten tip by its own attraction force. The nanofiber actuator 100 is irradiated with laser light. As shown in FIG. 2, during a heating process and a cooling process, the nanofiber actuator 100 bends in two opposite directions separately. Therefore, the nanofiber actuator 100 has a bidirectional actuation characteristic.

Taking the axis of the nanofiber actuator 100 as a reference, when the nanofiber actuator 100 bents toward the first side, the actuation behavior is defined as a positive actuation; when the nanofiber actuator 100 bents toward the second side different from the first side n, the actuation behavior is defined as a negative actuation. Referring to FIG. 5, the nanofiber actuator 100 has four actuation stages during heating and cooling. In the process of heating the nanofiber actuator 100, the actuation process of the nanofiber actuator 100 comprises a first actuation stage and a second actuation stage. In the process of cooling the nanofiber actuator 100, the actuation process of the nanofiber actuator 100 comprises a third actuation stage and a fourth actuation stage. During the actuation process of the nanofiber actuator 100, the first actuation stage and the fourth actuation stage are negative actuation, and the second actuation stage and the third actuation stage are positive actuation.

The phase transition temperature of the vanadium dioxide layer 14 is about 65° C. When a temperature of the vanadium dioxide layer 14 is below the phase transition temperature, for example, the vanadium dioxide layer 14 has an insulating phase at normal temperature. Thus, the vanadium dioxide layer 14 acts as an insulator. When the temperature of the vanadium dioxide layer 14 is heated to the phase transition temperature, the vanadium dioxide layer 14 undergoes a phase transition from an insulating phase to a metallic phase, and also causes volume shrinkage along a c-axis direction of the metallic phase. Therefore, when the temperature of the nanofiber actuator 100 is greater than or equal to the phase transition temperature of the vanadium dioxide layer 14, the nanofiber actuator 100 bends to the first (second) side. When the temperature of the nanofiber actuator 100 is lower than the phase transition temperature of the vanadium dioxide layer 14, the nanofiber actuator 100 bends to the second side.

The volume shrinkage of the vanadium dioxide layer 14 caused by phase transition determines the positive actuation of the nanofiber actuator 100 in the second actuation stage and the negative actuation of the nanofiber actuator 100 in the fourth actuation stage. Referring to Table 1, since vanadium dioxide has a larger thermal expansion coefficient than alumina and carbon nanotubes, the actuation of the nanofiber actuator 100 in the first actuation stage is negatively actuation, and the actuation of the nanofiber actuator 100 in the third actuation stage is positive actuation. Specifically, in the first actuation stage, since the thermal expansion coefficient of vanadium dioxide is greater than that of alumina and carbon nanotubes, the volume change of the first side of the nanofiber actuator 100 after heating is larger than the volume of the second side. Therefore, the nanofiber actuator 100 is bents to the second side. During the third actuation stage of cooling the nanofiber actuator 100, the thermal expansion coefficient of the nanofiber actuator 100 still maintains the thermal expansion coefficient of the second actuation stage. Therefore, the second side of the nanofiber actuator 100 still continues to bend, that is, the actuation behavior of the nanofiber actuator 100 remains positively actuation.

TABLE 1

Material properties of nanofiber actuators

| | Material | | |
|---|---|---|---|
| | Carbon nanotubes | Alumina | Vanadium dioxide |
| Poisson's ratio | 0.2 | 0.22 | 0.3 |
| Young's modulus (GPa) | 450 | 400 | 140 |

TABLE 1-continued

Material properties of nanofiber actuators

| | Material | | |
|---|---|---|---|
| | Carbon nanotubes | Alumina | Vanadium dioxide |
| Thermal condutivity (Wm$^{-1}$K$^{-1}$) | 2000 | 35 | 5 |
| Heat capacity (JKg$^{-1}$K$^{-1}$) | 1000 | 730 | 700 |
| Coefficient of thermal expansion (10$^{-6}$K$^{-1}$) | 3 | 6.5 | α (T) |

Figure 6:
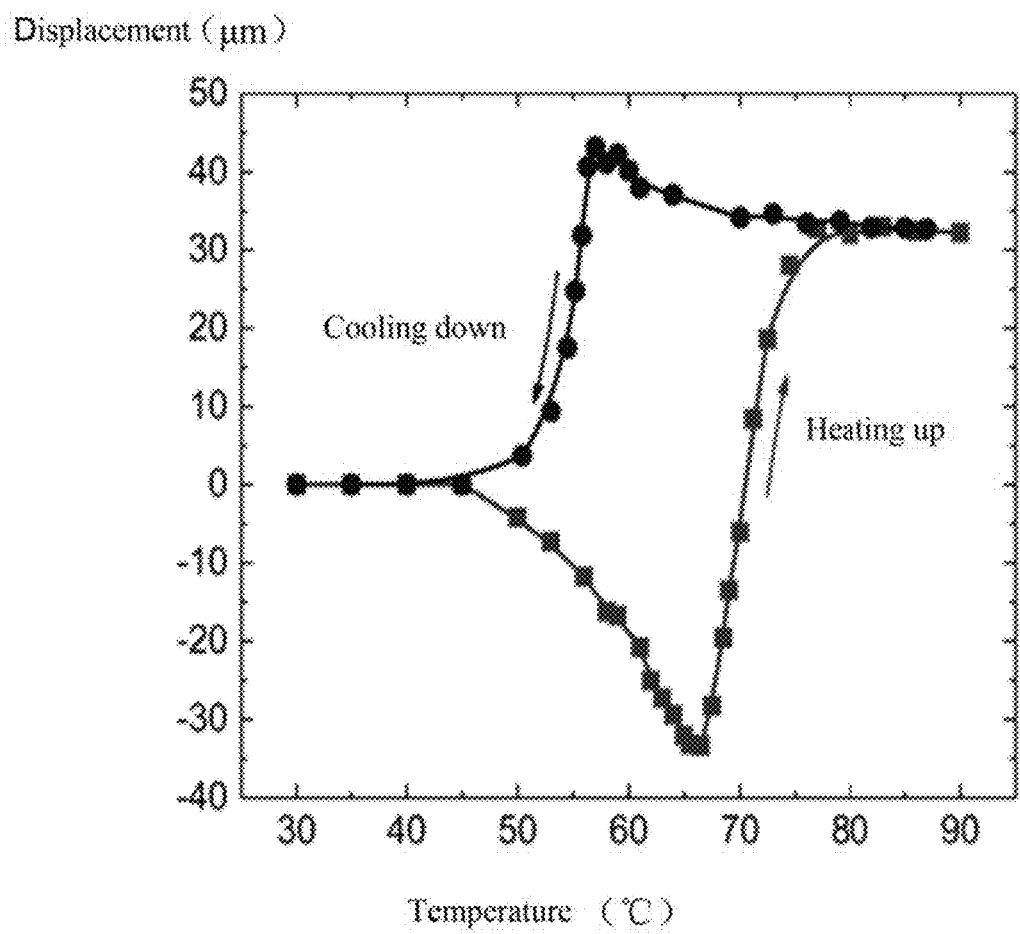
FIG. 6 is a functional relationship of one embodiment between a displacement of the nanofiber actuator and a heating temperature.

FIG. 6 is a function diagram of a displacement of the nanofiber actuator 100 and the heating temperature. A heating plate is used to heat the nanofiber actuator 100. The material of the heating plate is Pi heating belt and copper block. As shown FIG. 6, the nanofiber actuator 100 is bidirectionally actuated and has a large displacement during heating and cooling. Therefore, the nanofiber actuator 100 has a large deformation.

Figure 7:
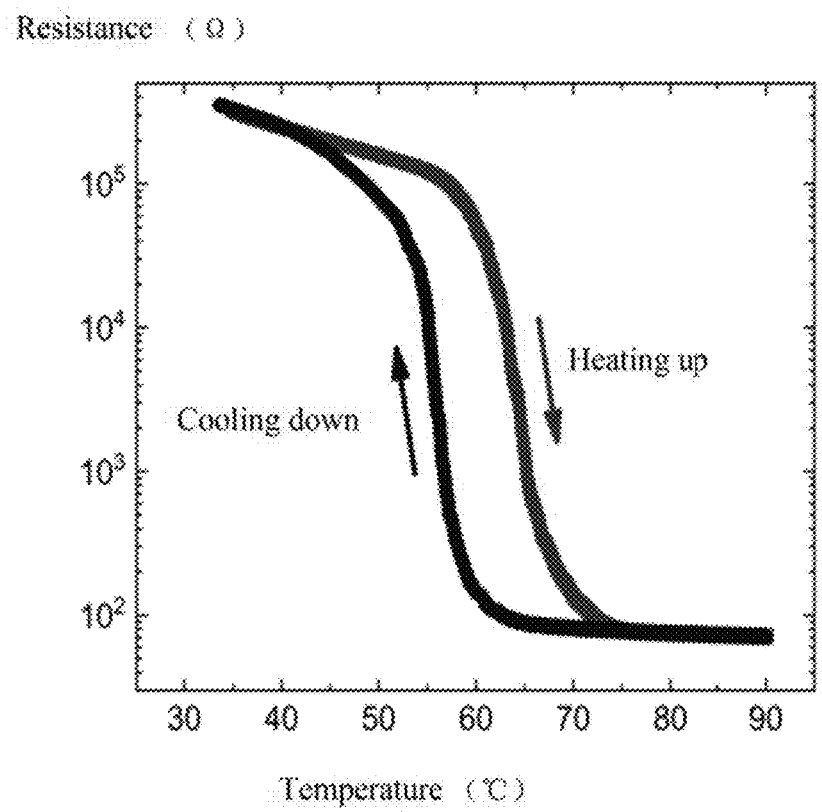
FIG. 7 is a graph showing a relationship between resistance and temperature of a pure vanadium dioxide film during heating and cooling.
Figure 8:
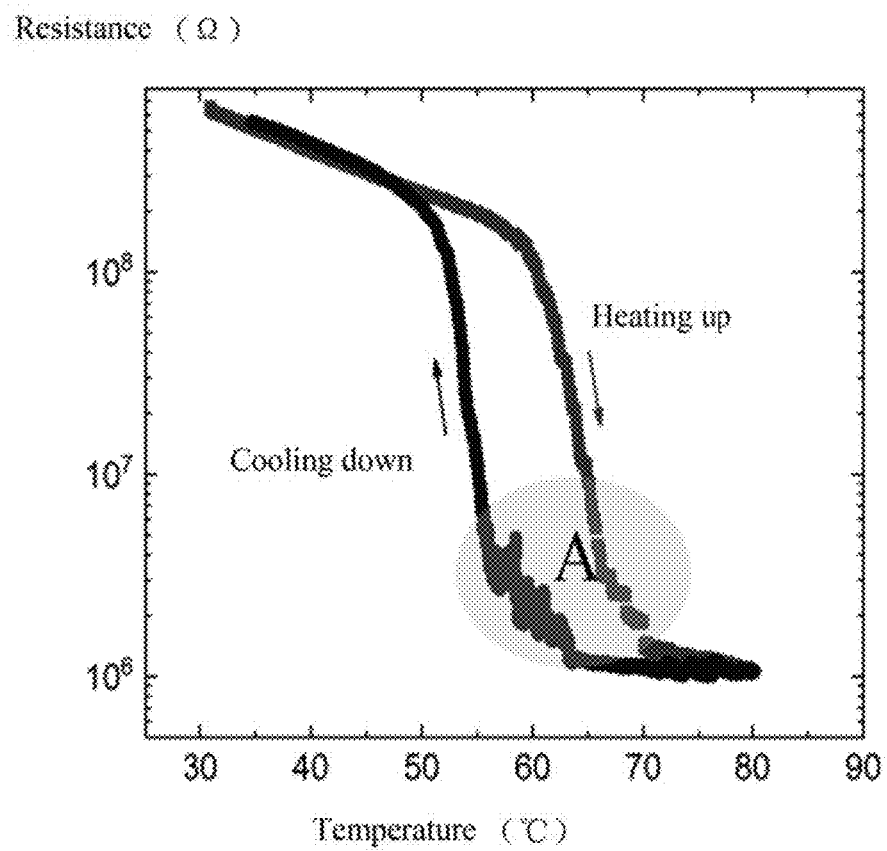
FIG. 8 is a graph showing a relationship between resistance and temperature of the nanofiber actuator during heating and cooling.

FIG. 7 is a graph showing a relationship between resistance and temperature of a pure vanadium dioxide film during heating and cooling. FIG. 8 is a graph showing a relationship between resistance and temperature of the nanofiber actuator 100 during heating and cooling. In FIG. 7, the pure vanadium dioxide film is located on a quartz substrate, and in FIG. 8, the nanofiber actuator 100 is located on a silicon substrate coated by a silicon oxide coating. The pure vanadium dioxide film and the nanofiber actuator 100 are tested under the same parameters. As shown in FIG. 7 that during heating and cooling of the pure vanadium dioxide thin film, the resistance of the pure vanadium dioxide thin film sharply decreases by about three orders of magnitude. As shown in FIG. 8, during heating and cooling of the nanofiber actuator 100, the resistance of the nanofiber actuator 100 changes by approximately 200 times throughout the MIT region. It can be seen that the resistance change rate of the nanofiber actuator 100 is lower than that of the pure vanadium dioxide film.

Figure 9:
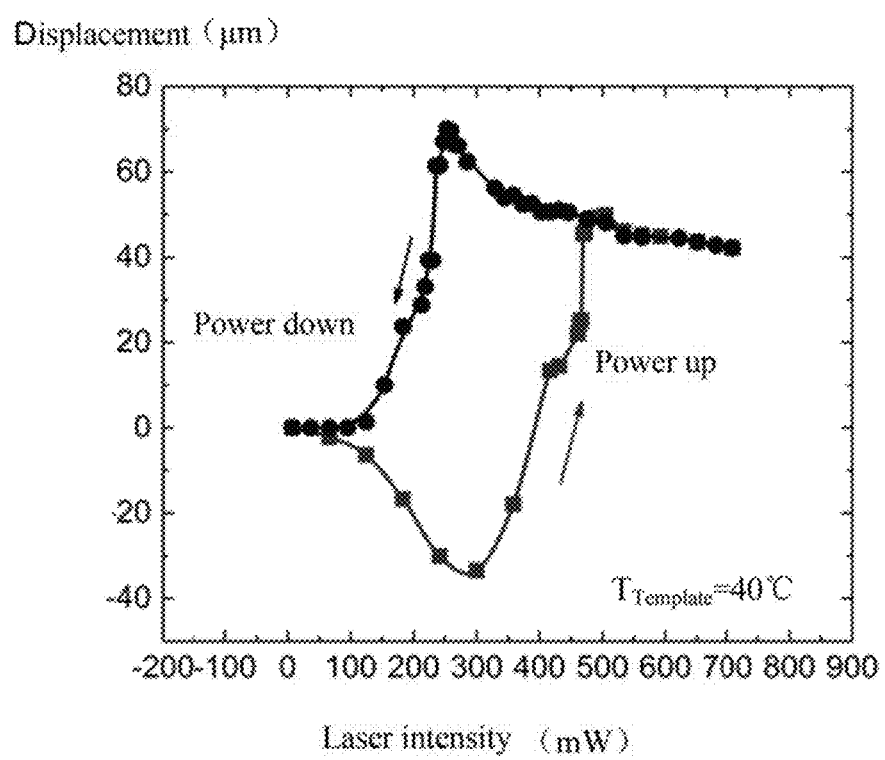
FIG. 9 is a function diagram of one embodiment of a displacement of the nanofiber actuator and a laser power intensity.

FIG. 9 is a function diagram of a displacement of the nanofiber actuator 100 and a laser power intensity. A laser with a wavelength of 808 nanometers is used to irradiate the nanofiber actuator 100 with a length of 50 micrometers, and the nanofiber actuator 100 absorbs the heat of the laser and performs bidirectional actuation. As shown in FIG. 9, during the heating process, the nanofiber actuator 100 achieves a maximum negative displacement of about 37 μm at a power intensity of 300 mW, and the nanofiber actuator 100 achieves a maximum positive displacement of about 45 μm at a power intensity of 460 mW.

In the nanofiber actuator 100, the vanadium dioxide layer 14 and the composite structure 12 are arranged non-coaxially, and a thermal mismatch between the vanadium dioxide layer 14 and the composite structure 12 makes the nanofiber actuator 100 have a large-scale bidirectional actuation function. The nanofiber actuator 100 has a large displacement in both directions. Since the diameter of the nanofiber actuator 100 is in nanometer sized, a response speed of the nanofiber actuator 100 is fast, and at the same time, a mass of the nanofiber actuator 100 is reduced, which is beneficial to the application of the nanofiber actuator 100.

Figure 10:
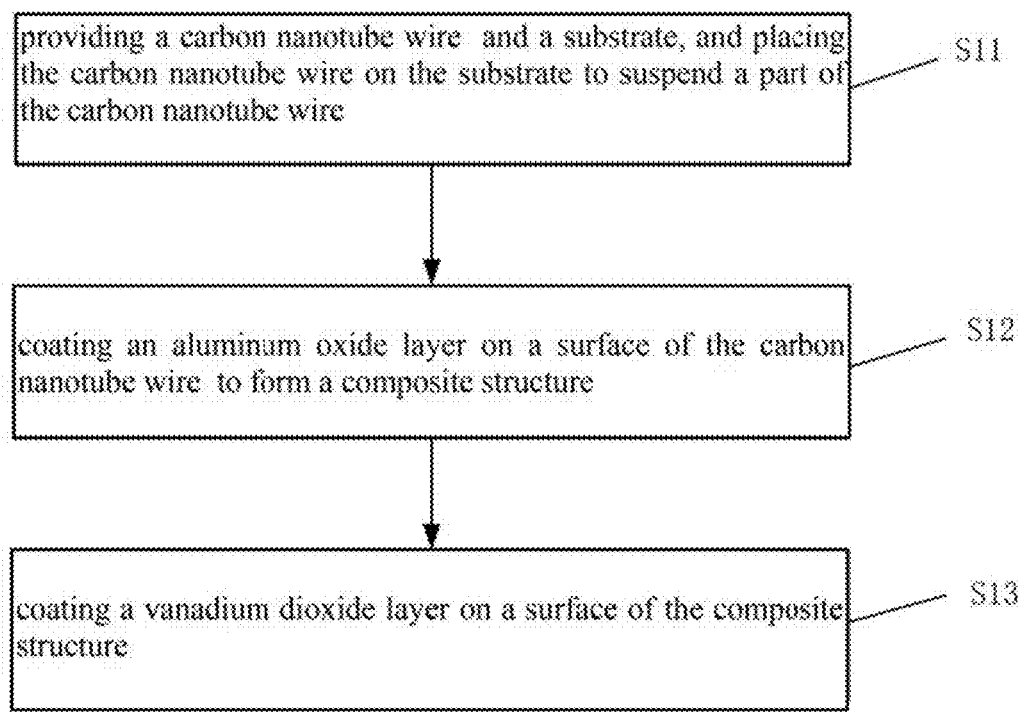
FIG. 10 is a flowchart of one embodiment of a method for making the nanofiber actuator.

FIG. 10 illustrates a method of one embodiment of making a nanofiber actuator 100, the method comprises:
S11, providing a carbon nanotube wire 121 and a substrate, and placing the carbon nanotube wire 121 on the substrate to suspend a part of the carbon nanotube wire 121;
S12, coating an aluminum oxide layer 123 on a surface of the carbon nanotube wire 121 to form a composite structure 12; and
S13, coating a vanadium dioxide layer 14 on a surface of the composite structure 12.

In the step S11, the carbon nanotube wire 121 is grown on the substrate by a physical vapor deposition method or a chemical vapor deposition method. The carbon nanotube wire 121 comprises at least one carbon nanotube. The material of the substrate can be silicon, silicon oxide, silicon nitride, and combinations thereof. The substrate can comprise a plurality of gaps. The plurality of gaps can be formed by a photolithography method. When the carbon nanotube wire 121 is located on the substrate, the carbon nanotube 121 corresponding to the gap is suspended. In one embodiment, the carbon nanotube wire 121 is a single carbon nanotube grown by chemical vapor deposition. The material of the substrate is Si—SiO$_2$—Si$_3$N$_4$. The substrate has seven elongated gas with a width of about 350 microns.

In one embodiment, in step S11, a Fe catalyst film is located on a Si—SiO$_2$—Si$_3$N$_4$ substrate to grow carbon nanotubes by the chemical vapor deposition method. Specifically, the substrate provided with the catalyst is transferred to a quartz tube, and carbon nanotubes grow with flowing a hydrogen gas (216 sccm), an ethylene gas (0.8 sccm), a carbon dioxide gas (0.3 sccm) in an argon atmosphere (452 sccm) at 970° C. for 14 min, then the temperature is decreased to 600° C., a flow rate of the argon atmosphere is increased to 1000 sccm, an ethylene gas and the carbon dioxide gas are turned off, and maintained for 10 min. Finally, the substrate is naturally cooled down to a room temperature. The carbon nanotube is an ultra-long carbon nanotube with a length greater than about 1 cm.

In the step S12, the aluminum oxide layer 123 is coated and covered on the surface of the carbon nanotube wire 121 by an atomic layer deposition method. Specifically, the composite structure 12 is formed by uniformly coating the aluminum oxide layer 123 on the outer surface of the suspended portion of the carbon nanotube wire 121 by the atomic layer deposition method. In one embodiment, a trimethyl aluminum (TMA) is used as a metal precursor, and H$_2$O and nitrogen (N$_2$) are used as an oxygen source and a carrier gas. The substrate provided with the carbon nanotube wire 121 is transferred to a chamber of an ALD system (NorthStar™, SVTA, USA), and the aluminum oxide layer 123 is deposited at about 120° C. The flow rate of N$_2$ is about 5 sccm. The thickness of the aluminum oxide layer 123 is about 10 nm.

In step S13, the method of coating the vanadium dioxide layer 14 on the surface of the composite structure 12 comprises:
S131, depositing a VO$_x$ layer on the surface of the aluminum oxide layer 123 to form a VO$_x$ composite; and
S132. annealing the VO$_x$ composite in an oxygen atmosphere, wherein the VO$_x$ layer is transformed into the vanadium dioxide layer 14.

In step S131, a method for depositing the vanadium oxide layer is not limited, and it can be a chemical vapor deposition method, a magnetron sputtering method, or the like. In step S132, the oxygen atmosphere can be pure oxygen gas or air.

In one embodiment, in step S131, the VO$_x$ layer is deposited on the surface of the aluminum oxide layer 123 by DC magnetron sputtering. The DC magnetron sputtering system has a high-purity vanadium metal target. The sputtering is carried out with flowing gas mixtures of 49.7 standard cubic centimeters per minute (sccm) Ar and 0.3 sccm $O_2$, for 25 minutes, at DC power of 60 W, and at room temperature. In the step S132, the $VO_x$ composite is annealed in low-pressure pure $O_2$ atmosphere under $3 \times 10^{-2}$ mbar at 450° C. for 10 minutes.

Alternatively, between the steps S11 and S12, a step of forming the carbon layer 125 on the surface of the carbon nanotube wire 121 can be comprised. Specifically, the carbon layer 125 is coated on the surface of the carbon nanotube wire 121 by DC magnetron sputtering. In one embodiment, an amorphous carbon is coated and covered on the surface of the carbon nanotube wire 121 by DC magnetron sputtering. The sputtering is carried out at room temperature with flowing argon gas (25 sccm) under 0.3 pa for 10 s, at DC power of 72 W. A thickness of the carbon layer 125 is about 0.92 nm.

The method for making the nanofiber actuator 100 provided in this embodiment is simple to operate and is beneficial to mass production. In step S12, the aluminum oxide layer 123 is formed on the surface of the suspended carbon nanotube wire 121 by atomic layer deposition, and the aluminum oxide layer 123 is uniformly coated on the surface of the suspended portion of the carbon nanotube wire 121, and, the aluminum oxide layer 123 is located coaxially with the carbon nanotube wire 121. In step S13, a $VO_x$ layer is deposited on the surface of the aluminum oxide layer 123 by DC magnetron sputtering, and then the vanadium dioxide layer 14 is formed through annealing. The vanadium dioxide layer 14 is coated on the surface of the composite structure 12, and the vanadium dioxide layer 14 and the composite structure 12 are located non-coaxially.

Figure 11:
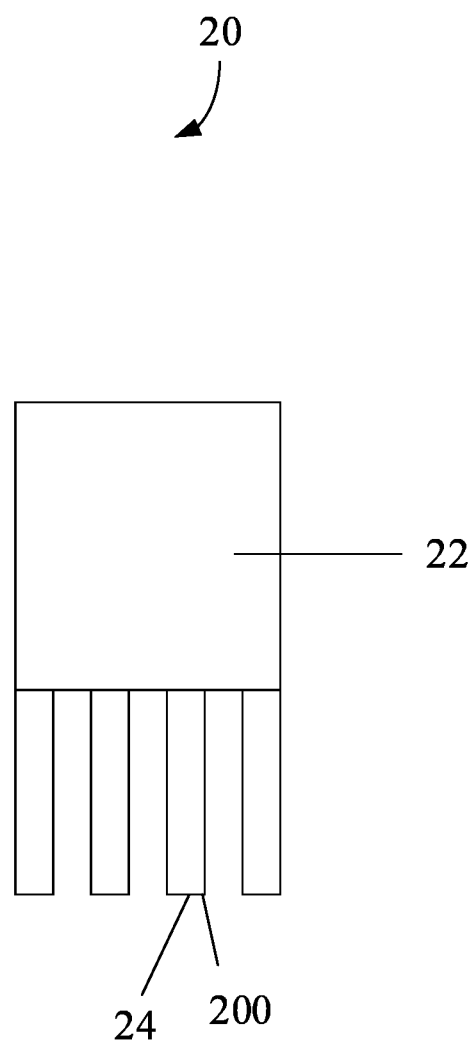
FIG. 11 is a view of the second embodiment of a bionic arm.

Referring to FIG. 11, a bionic arm 20 of a second embodiment is provided. The bionic arm 20 comprises a bionic palm 22 and at least one finger 24. The at least one finger 24 is a nanofiber actuator 200. The structure of the nanofiber actuator 200 is the same as that of the nanofiber actuator 100, except that a diameter of the nanofiber actuator 200 is greater than the diameter of the nanofiber actuator 100. The diameter of the nanofiber actuator 200 is in a range from about 0.5 cm to about 3 cm.

The nanofiber actuator 200 comprises a composite structure 12 and a vanadium dioxide layer 14. The composite structure 12 comprises a carbon nanotube wire 121 and an aluminum oxide layer 123. The aluminum oxide layer 123 is coated on a surface of the carbon nanotube wire 121, and the aluminum oxide layer 123 and the carbon nanotube wire 121 are located coaxially. The vanadium dioxide layer 14 is coated on a surface of the composite structure 12, and the vanadium dioxide layer 14 and the composite structure 12 are located non-coaxially. In the nanofiber actuator 200, a thickness of the vanadium dioxide layer 14 can be selected according to actual needs, and a ratio between a maximum thickness of the vanadium dioxide layer 14 and a minimum thickness of the vanadium dioxide layer 14 is in a range from about 9:1 to about 7:1. In one embodiment, the ratio between the maximum thickness of the vanadium dioxide layer 14 and the minimum thickness of the vanadium dioxide layer 14 is about 8:1. A percentage of the diameter of the composite structure 12 to the diameter of the nanofiber actuator 200 is in a range from about 10% to about 30%. In one embodiment, the ratio between the maximum thickness of the vanadium dioxide layer 14 and the minimum thickness of the vanadium dioxide layer 14 is about 8:1, and the percentage of the diameter of the composite structure 12 to the diameter of the nanofiber actuator 200 is about 20%.

A method of fixing the nanofiber actuator 200 to the bionic palm 22 is not limited. For example, the nanofiber actuator 200 can be fixed to the bionic palm 22 by pasting or welding. A material and shape of the bionic palm 22 can be selected according to actual needs. The material of the bionic palm 22 can be a conductive material or an insulating material. The conductive material can be metal such as silver, copper, gold, aluminum, tungsten, nickel, iron, or combination thereof. The insulating material is ceramic, glass, or rubber. When the bionic palm 22 is formed by the conductive material, the bionic palm 22 can be energized by energizing the carbon nanotube wire 121 to heat and actuate the nanofiber actuator 200. When the bionic palm 22 is formed by the insulating material, the nanofiber actuator 200 can be heated by laser irradiation to actuate the nanofiber actuator 200. The laser can be lasers of various colors, modulated laser beams, or unmodulated laser beams, as long as a certain intensity can be achieved to bend and actuate the nanofiber actuator 200.

In one embodiment, the bionic arm 20 comprises four fingers 24 spaced from each other. The material of the bionic palm 22 is aluminum, and the nanofiber actuator 200 is fixed to the bionic palm 22 by a silver paste.

When the finger 24 is irradiated with laser light or the finger 24 is energized, the vanadium dioxide layer and the composite structure are not located coaxially in the finger 24, and a thermal mismatch between the composite structure and the vanadium dioxide layer allows the finger 24 to bidirectionally actuate and have a large deformation and a fast response speed. Therefore, the finger 24 can be quickly bent to realize a touch and grip function.

Figure 12:
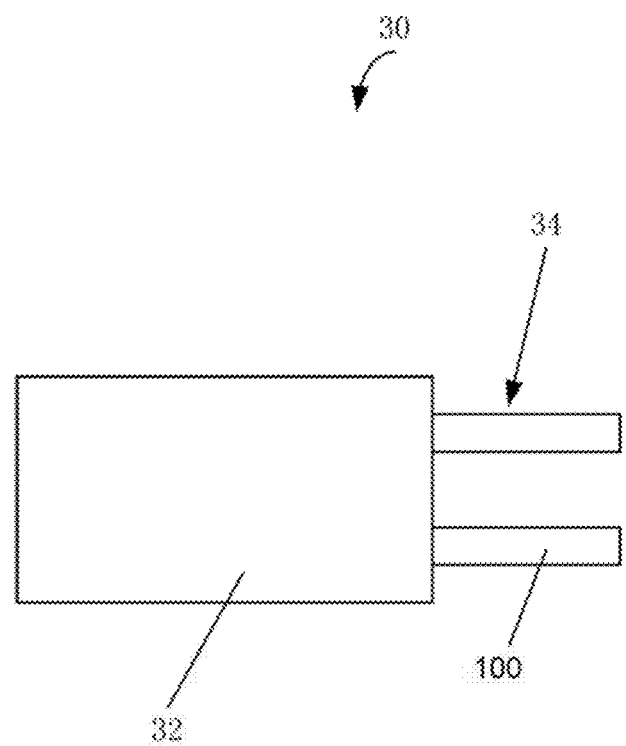
FIG. 12 is a view of the third embodiment of a nano manipulator.

Referring to FIG. 12, a nano manipulator 30 of a third embodiment is provided. The nano manipulator 30 comprises a base 32 and a clamping structure 34, and the clamping structure 34 comprises two nanofiber actuators 100. The two nanofiber actuators 100 are located on the base 32 and spaced from each other. The nanofiber actuator 100 comprises a composite structure 12 and a vanadium dioxide layer 14. The composite structure 12 comprises a carbon nanotube wire 121 and an aluminum oxide layer 123. The aluminum oxide layer 123 is coated on a surface of the carbon nanotube wire 121, and the aluminum oxide layer 123 and the carbon nanotube wire 121 are located coaxially. The vanadium dioxide layer 14 is coated on a surface of the composite structure 12, and the vanadium dioxide layer 14 and the composite structure 12 are located non-coaxially. Using the axis of the nanofiber actuator 100 as a reference, a side with a larger thickness of the vanadium dioxide layer 14 is defined as the first side, and a side with a smaller thickness of the vanadium dioxide layer 14 is defined as the second side. The two first sides of the two nanofiber actuators 100 are located adjacent to each other, or the two second sides of the two nanofiber actuators 100 are located adjacent to each other.

The base 32 is used to support the nanofiber actuator 100. The method of fixing the nanofiber actuator 100 to the base 32 is not limited. For example, the nanofiber actuator 100 can be fixed on the base 32 by pasting, welding, or attraction between the nanofiber actuator 100 and the base 32. A material and shape of the base 32 can be selected according to actual needs. The material of the base 32 can be a conductive material or an insulating material. The conductive material can be metal such as silver, copper, gold, aluminum, tungsten, nickel, iron, or combination thereof. The insulating material is ceramic, glass, or rubber. When the base 32 is formed by the conductive material, the carbon nanotube wire 121 can be energized by energizing the base 32 to heat and actuate the nanofiber actuator 100. When the base 322 is formed by the insulating material, the nanofiber actuator 100 can be heated by laser irradiation to actuate the nanofiber actuator 100. In one embodiment, the base 32 is a tungsten needle, and the two nanofiber actuators 100 are fixed to a tungsten needle tip through the attractive force between them.

Figure 13:
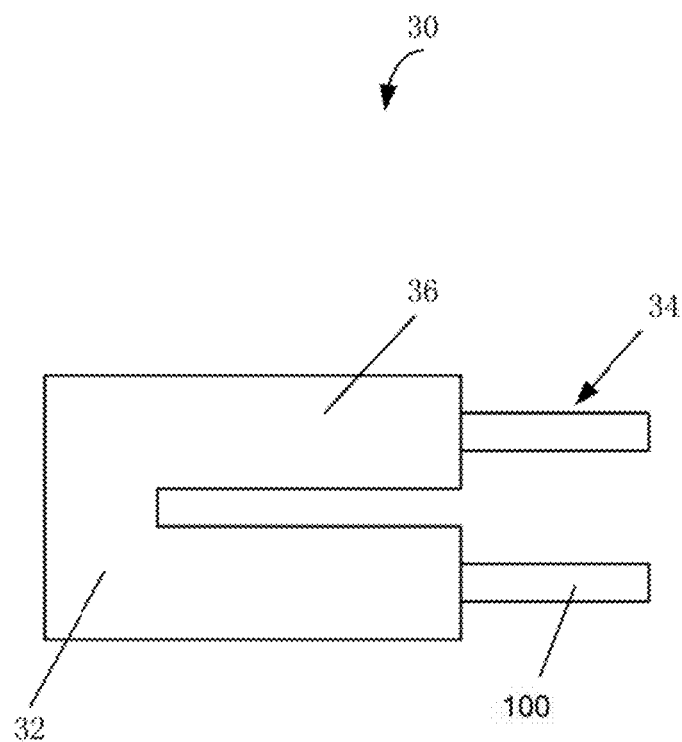
FIG. 13 is a view of another third embodiment of the nano manipulator.

The shape of the base 32 is not limited and can be selected according to actual needs. Referring to FIG. 12, the base 32 can be an integral structure, and the two nanofiber actuators 100 are located at one end of the base 32 and spaced from each other. Referring to FIG. 13, in one embodiment, the base 32 comprises two manipulation arms 36, and the two manipulation arms 36 are spaced from each other. The two nanofiber actuators 100 are respectively located at the ends of the two manipulation arms 36. The distance between the two manipulation arms 36 can be designed according to actual needs. In one embodiment, the two nanofiber actuators 100 are located at the end of a tungsten needle tip and spaced from each other.

The two first sides of the two nanofiber actuators 100 are located adjacent to each other, or the two second sides of the two nanofiber actuators 100 are located adjacent to each other. When the two first sides of the two nanofiber actuators 100 are located adjacent to each other, a distance between the two nanofiber actuators 100 first increases and then decreases as the temperature increases. When the two second sides of the two nanofiber actuators 100 are located adjacent to each other, the distance between the two nanofiber actuators 100 first decreases and then increases as the temperature increases. When the distance between the two nanofiber actuators 100 decreases, a function of clamping and transferring the target can be realized. In one embodiment, the two first sides of the two nanofiber actuators 100 are located adjacent to each other.

Figure 14A:
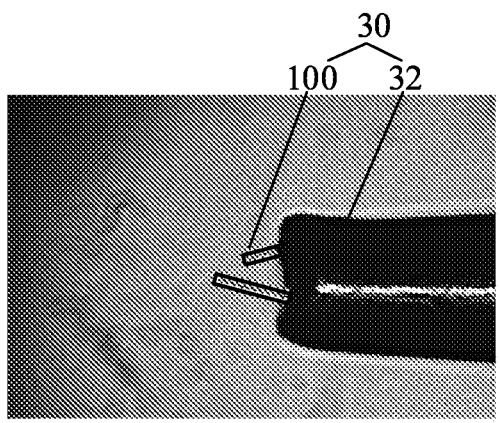
FIG. 14A-FIG. 14D are optical photographs of the third embodiment of the nano manipulator irradiated with laser light.
Figure 14B:
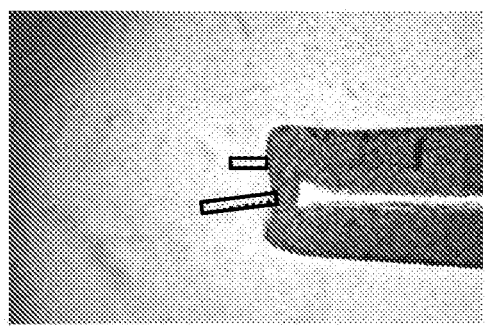
Figure 14C:
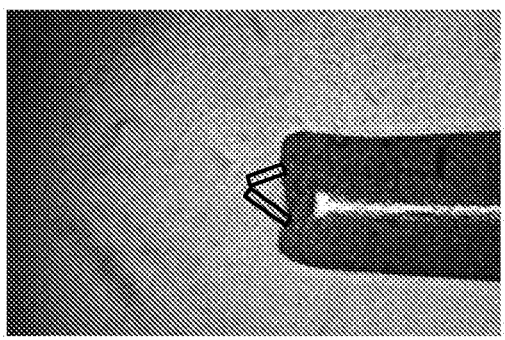
Figure 14D:
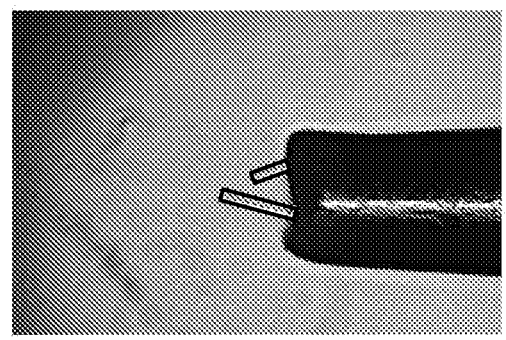

FIG. 14A-FIG. 14D are diagrams of the shape change process of the nano manipulator 30 when the nano manipulator 30 is irradiated with laser light. In FIG. 14A-FIG. 14D, the two first sides of the two nanofiber actuators 100 are located adjacent to each other. FIG. 14A shows an initial shape of the nano manipulator 30, and FIG. 14B shows the shape of the nano manipulator 30 when the nano manipulator 30 is initially irradiated with laser light. FIG. 14C shows the shape of the nano manipulator 30 when the nano manipulator 30 is continuously irradiated with laser light. FIG. 14D shows the shape of the nano manipulator 30 after stopping a laser irradiation of the nano manipulator 30. As shown in FIG. 14B, when the nano manipulator 30 is irradiated with laser light, a temperature of the nanofiber actuator 100 has not reached a phase transition temperature of the vanadium dioxide layer 14, at this time, the nanofiber actuator 100 is bent toward the second side. Therefore, the distance between the two nanofiber actuators 100 becomes larger. As shown in FIG. 14C, when the nano manipulator 30 is continuously irradiated with laser light, the temperature of the nanofiber actuator 100 continues to increase, and the temperature of the nanofiber actuator 100 reaches and exceeds the phase transition temperature of the vanadium dioxide layer 14, at this time, the nanofiber actuator 100 bends toward the first side. Therefore, the distance between the two nanofiber actuators 100 becomes smaller and contacts each other. As shown in FIG. 14D, after the laser irradiation of the nano manipulator 30 is stopped, the nano manipulator 30 returns to the original shape as the temperature decreases.

The nano manipulator 30 comprises two of the nanofiber actuators 100. In the nanofiber actuator 100, the vanadium dioxide layer 14 and the composite structure 12 are located non-coaxially, and a thermal mismatch between the vanadium dioxide layer 14 and the composite structure 12 makes the nanofiber actuator 100 to have a large-scale bidirectional actuation function, have large displacements and large deformations, which facilitates the nano manipulator 30 to clamp and transfer the target. Since the diameter of the nanofiber actuator 100 is on the nanometer level, it is advantageous for clamping nanometer particles, and at the same time, the response speed of the nanofiber actuator 100 is fast, which is beneficial to increase the clamping speed.

Figure 15:
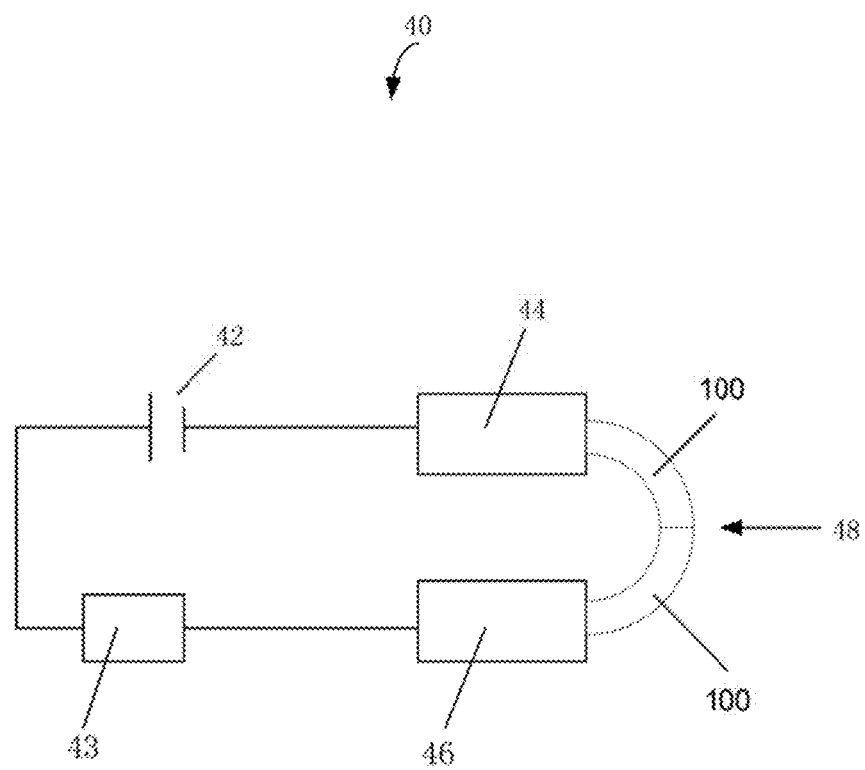
FIG. 15 is a view of the fourth embodiment of a laser remote control switching system.

Referring to FIG. 15, a laser remote control switching system is provided. The laser remote control switch system comprises a laser source and a control circuit 40. The control circuit 40 comprises a power 42, an electronic device 43, a first electrode 44, a second electrode 46, and a photosensitive element 48. The power 42, the electronic device 43, the first electrode 44, the photosensitive element 48 and the second electrode 46 are electrically connected in sequence to form a loop. The photosensitive element 48 comprises two nanofiber actuators 100. The nanofiber actuator 100 comprises a composite structure 12 and a vanadium dioxide layer 14. The composite structure 12 comprises a carbon nanotube wire 121 and an aluminum oxide layer 123. The aluminum oxide layer 123 is coated on a surface of the carbon nanotube wire 121, and the aluminum oxide layer 123 and the carbon nanotube wire 121 are located coaxially. The vanadium dioxide layer 14 is coated on a surface of the composite structure 12, and the vanadium dioxide layer 14 and the composite structure 12 are located non-coaxially. The laser source is used to irradiate the photosensitive element 48, and the nanofiber actuator 100 in the photosensitive element 48 bends and actuates with changes in temperature to open or close the loop, that is, the control circuit 40 is turned off and on.

The two nanofiber actuators 100 are respectively located at the ends of the first electrode 44 and the second electrode 46. A distance between the two nanofiber actuators 100 and positions located on the ends of the first electrode 44 and the second electrode 46 can be designed according to actual needs, as long as the two nanofiber actuators 100 can bent and be in contact with each other. Specifically, the first electrode 44 has a first end and a second end opposite to the first end. The second electrode 46 has a third end and a fourth end opposite to the forth end. The second end and the fourth end are adjacent and spaced from each other, and the two nanofiber actuators 100 are respectively located on the second end and the fourth end. In one embodiment, the second end and the fourth end are located parallel and spaced from each other. In one embodiment, the first electrode 44 and the second electrode 46 are parallel and spaced from each other. The two nanofiber actuators 100 are respectively fixed to the second end of the first electrode 44 and the fourth end of the second electrode 46 by silver paste. The two nanofiber actuators 100 are also are located parallel and spaced from each other. Using the axis of the nanofiber actuator 100 as a reference, a side with a larger thickness of the vanadium dioxide layer 14 is defined as the first side, and a side with a smaller thickness of the vanadium dioxide layer 14 is defined as the second side. The two first sides of the two nanofiber actuators 100 are located adjacent to each other, or the two second sides of the two nanofiber actuators 100 are located adjacent to each other. In one embodiment, the two first sides of the two nanofiber actuators 100 are located adjacent to each other.

In the laser remote control switching system, the photosensitive element 48 is irradiated with a laser light emitted by the laser source to turn on the control circuit 40, so that a current flows through the electronic device 43 to operate the electronic device 43. The laser source is a laser emitting device. The laser can be lasers of various colors, modulated laser beams, or unmodulated laser beams, as long as a certain intensity can be achieved to bend the nanofiber actuator 100 in the photosensitive element 48 to turn on the control circuit 40.

In one embodiment, the photosensitive element 48 is irradiated with a laser. When a temperature of the nanofiber actuator 100 does not reach a phase transition temperature of the vanadium dioxide layer 14, the nanofiber actuator 100 bents toward the second side. At this time, a distance between the two nanofiber actuators 100 becomes larger. The photosensitive element 48 is continuously irradiated with a laser, the temperature of the nanofiber actuator 100 continues to rise, and when the temperature of the nanofiber actuator 100 reaches and exceeds the phase transition temperature of the vanadium dioxide layer 14, the nanofiber actuator 100 is bents toward the first side. At this time, the distance between the two nanofiber actuators 100 becomes smaller and eventually contacts with each other to turn on the control circuit 40, causing current to flow through the electronic device 43 and start the electronic device 43.

The electronic device 43 is a remote object controlled by the laser remote control switch system. The electronic device 43 can be household appliances, such as lamps, air conditioners, televisions, etc., but is not limited to the above types.

In the laser remote control switching system, the photosensitive element 48 comprises two nanofiber actuators 100. The vanadium dioxide layer 14 and the composite structure 12 in the nanofiber actuator 100 are located non-coaxially, and a thermal mismatch between the vanadium dioxide layer 14 and the composite structure 12 makes the nanofiber actuator 100 have a large-scale bidirectional actuation function. Irradiating the photosensitive element 48 with laser light to make the two nanofiber actuators 100 bent and contact with each other directly in order to turn on the control circuit 40 and achieve the purpose of remotely controlling the electronic device 43. The laser light emitted by the laser source is directly used as a control signal. The signal received by the photosensitive element 48 does not require a demodulation and amplification circuit, so that the control circuit has a simple structure, low cost, greatly improved reliability, and strong anti-interference. Moreover, a diameter of the nanofiber actuator 100 is nanoscale, thus the nanofiber actuator 100 has a faster response rate, thereby improving a sensitivity of the laser remote control switching system.

Even though numerous characteristics and advantages of certain inventive embodiments have been set out in the foregoing description, together with details of the structures and functions of the embodiments, the disclosure is illustrative only. Changes can be made in detail, especially in matters of an arrangement of parts, within the principles of the present disclosure to the full extent indicated by the broad general meaning of the terms in which the appended claims are expressed.

Depending on the embodiment, certain of the steps of methods described can be removed, others can be added, and the sequence of steps can be altered. It is also to be understood that the description and the claims drawn to a method can comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes can be made in the detail, especially in matters of shape, size and arrangement of the parts within the principles of the present disclosure up to, and including the full extent established by the broad general meaning of the terms used in the claims. It will, therefore, be appreciated that the embodiments described above can be modified within the scope of the claims.

What is claimed is:

1. A nanofiber actuator comprising:
   a composite structure comprising a carbon nanotube wire and an aluminum oxide layer, wherein the aluminum oxide layer is coated on a surface of the carbon nanotube wire, and the aluminum oxide layer and the carbon nanotube wire are located coaxially with each other; and
   a vanadium dioxide layer wrapping an entire surface of the composite structure, wherein the vanadium dioxide layer and the composite structure are located non-coaxially with each other.

2. The nanofiber actuator of claim 1, wherein a ratio between a maximum thickness of the vanadium dioxide layer and a minimum thickness of the vanadium dioxide layer is in a range from approximately 9:1 to approximately 7:1.

3. The nanofiber actuator of claim 2, wherein the maximum thickness of the vanadium dioxide layer is approximately 72 nm, and the minimum thickness of the vanadium dioxide layer is approximately 9 nm.

4. The nanofiber actuator of claim 1, wherein a length of the carbon nanotube wire is in a range from approximately 10 μm to approximately 3 cm.

5. The nanofiber actuator of claim 1, wherein a diameter of the carbon nanotube wire is in a range from approximately 0.5 nm to approximately 100 nm.

6. The nanofiber actuator of claim 1, wherein the carbon nanotube wire is an ultra-long carbon nanotube, and a length of the ultra-long carbon nanotube is greater than 1 cm.

7. The nanofiber actuator of claim 1, wherein the carbon nanotube wire is a non-twisted carbon nanotube wire, the non-twisted carbon nanotube wire comprises a plurality of carbon nanotubes, and the plurality of carbon nanotubes are substantially parallel to each other and joined end to end by Van der Waals attractive force along an axis of the carbon nanotube wire.

8. The nanofiber actuator of claim 1, wherein the carbon nanotube wire is a twisted carbon nanotube wire, and the twisted carbon nanotube wire comprises a plurality of carbon nanotubes oriented around an axial direction of the twisted carbon nanotube wire.

9. The nanofiber actuator of claim 8, wherein the composite structure further comprises a carbon layer, the carbon layer is located between the carbon nanotube wire and the aluminum oxide layer, and the carbon layer is located coaxially with the carbon nanotube wire and the aluminum oxide layer.

10. The nanofiber actuator of claim 1, wherein a material of the vanadium dioxide layer is pure vanadium dioxide.

11. The nanofiber actuator of claim 10, wherein a doped element in the vanadium dioxide layer is tungsten, molybdenum, aluminum, phosphorus, niobium, thallium, fluorine or combinations thereof.

12. The nanofiber actuator of claim 1, wherein the nanofiber actuator is a wire structure.

13. A nanofiber actuator comprising:
a composite structure comprising a carbon nanotube wire and an aluminum oxide layer, wherein the aluminum oxide layer is wrapped around an entire surface of the carbon nanotube wire, and the aluminum oxide layer and the carbon nanotube wire are located coaxially with each other; and
a vanadium dioxide layer directly wrapping an entire surface of the composite structure, wherein the vanadium dioxide layer and the composite structure are located non-coaxially with each other.

* * * * *